United States Patent
Niebojewski et al.

(10) Patent No.: US 9,978,602 B2
(45) Date of Patent: May 22, 2018

(54) METHOD OF MAKING A TRANSISTOR

(71) Applicants: COMMISSARIAT A L'ENERGIE ATOMIQUE ET AUX ENE ALT, Paris (FR); STMICROELECTRONICS (Crolles 2) SAS, Crolles (FR); STMICROELECTRONICS SA, Montrouge (FR)

(72) Inventors: Heimanu Niebojewski, Grenoble (FR); Yves Morand, Grenoble (FR); Maud Vinet, Rives sur Fure (FR)

(73) Assignees: COMMISSARIAT A L'ENERGIE ATOMIQUE ET AUX ENERGIES ALTERNATIVES, Paris (FR); STMICROELECTRONICS (Crolles 2) SAS, Crolles (FR); STMICROELECTRONICS SA, Montrouge (FR)

( * ) Notice: Subject to any disclaimer, the term of this patent is extended or adjusted under 35 U.S.C. 154(b) by 0 days. days.

(21) Appl. No.: 14/923,176

(22) Filed: Oct. 26, 2015

(65) Prior Publication Data
US 2016/0042955 A1    Feb. 11, 2016

Related U.S. Application Data

(63) Continuation of application No. 14/177,592, filed on Feb. 11, 2014, now abandoned.

(30) Foreign Application Priority Data

Feb. 11, 2013    (FR) ...................................... 13 51142

(51) Int. Cl.
*H01L 21/84* (2006.01)
*H01L 21/28* (2006.01)
(Continued)

(52) U.S. Cl.
CPC .. *H01L 21/28123* (2013.01); *H01L 21/02532* (2013.01); *H01L 21/02538* (2013.01);
(Continued)

(58) Field of Classification Search
CPC ... H01L 21/02; H01L 21/02667; H01L 21/84; H01L 21/76205
(Continued)

(56) References Cited

U.S. PATENT DOCUMENTS 6,020,615 A    2/2000    Lee
6,232,155 B1    5/2001    Lee
(Continued)

FOREIGN PATENT DOCUMENTS

DE    101 45 699 A1    4/2003
FR    2 938 202 A1    5/2010
(Continued)

OTHER PUBLICATIONS

Translation of JP 2004-296744 A, Hisaki Hara (Seiko Epson Corp), Mar. 26, 2003, 9 pages.*
(Continued)

*Primary Examiner* — Caridad Everhart
(74) *Attorney, Agent, or Firm* — Oblon, McClelland, Maier & Neustadt, L.L.P.

(57) ABSTRACT

The invention relates to a method for manufacturing a transistor comprising the preparation of a stack of layers of the semiconductor on insulator type comprising at least one substrate on which an insulating layer and an initial semiconductor layer are successively disposed. The method includes the formation of at least one oxide pad extending from a top face of the insulating layer, the formation of an additional layer made from semiconductor material covering the oxide pad and intended to form a channel for the transistor, the formation of a gate stack above the oxide pad,
(Continued)

and the formation of a source and drain on either side of the gate stack.

26 Claims, 7 Drawing Sheets

(51) Int. Cl.
  *H01L 29/66* (2006.01)
  *H01L 21/762* (2006.01)
  *H01L 21/02* (2006.01)

(52) U.S. Cl.
  CPC .. *H01L 21/02645* (2013.01); *H01L 21/02667* (2013.01); *H01L 21/7624* (2013.01); *H01L 29/66636* (2013.01)

(58) Field of Classification Search
  USPC .......................................................... 438/165
  See application file for complete search history.

(56) References Cited

U.S. PATENT DOCUMENTS

| | | | |
|---|---|---|---|
| 6,300,218 | B1 | 10/2001 | Cohen et al. |
| 6,468,880 | B1 | 10/2002 | Lim et al. |
| 6,593,205 | B1 | 7/2003 | Cheng et al. |
| 6,756,257 | B2 | 6/2004 | Davari et al. |
| 2006/0006389 | A1 | 1/2006 | Buchholtz et al. |
| 2006/0022270 | A1 | 2/2006 | Boyd et al. |
| 2006/0094182 | A1 | 5/2006 | Hanafi et al. |
| 2007/0045610 | A1 | 3/2007 | Lee et al. |
| 2007/0166890 | A1 | 7/2007 | Cheng et al. |
| 2007/0278591 | A1 | 12/2007 | Luo et al. |
| 2012/0273886 | A1 | 11/2012 | Zhong et al. |
| 2013/0146976 | A1 | 6/2013 | Flachowsky et al. |
| 2013/0214329 | A1 | 8/2013 | Liu |

FOREIGN PATENT DOCUMENTS

| | | |
|---|---|---|
| JP | 2004-296744 A | 10/2004 |
| JP | 2004296744 A | 10/2004 |
| WO | WO 2010/049654 A1 | 5/2010 |

OTHER PUBLICATIONS

French Preliminary Search Report issued Sep. 16, 2013 in Patent Application No. 1351144 (with English translation of Categories of Cited Documents).

A. Baghizadeh, et al., "Formation of As enriched layer by steam oxidation of As+-implanted Si" Applied Surface Science, vol. 255, 2009, pp. 5857-5860.

M. Bauer, et al., "Low temperature Si:C co-flow and hybrid process using $Si_3H_8/CI_2$," Thin Solid Films, vol. 520, 2012, pp. 3133-3138.

Erich Biermann, et al., "Oxide Growth Enhancement on Highly n-Type Doped Silicon under Steam Oxidation" J. Electrochem. Soc., vol. 143, No. 4, Apr. 1996, pp. 1434-1442.

B. E. Deal, et al., "Thermal Oxidation of Heavily Doped Silicon" Journal of the Electrochemical Society, vol. 112, No. 4, Apr. 1965, pp. 430-435.

E. Biermann, "Silicon Oxidation Rate Dependence on Dopant Pile-up" IEEE, 1989, 1 Page.

Yong-Hoon Son, et al., "Laser-induced Epitaxial Growth (LEG) Technology for High Density 3-D Stacked Memory with High Productivity" IEEE Xplore, VLSI Technology, 2007, 1 Page.

Chunshan Yin, et al., "Investigation of the source/drain asymmetric effects due to gate misalignment in planar double-gate MOSFETs" IEEE Xplore, Electronic Devices, vol. 52, No. 1, Jan. 2005, 1 Page.

K. Cheng, et al. "Fully Depleted Extremely Thin SOI Technology Fabricated by a Novel Integration Scheme Featuring Implant-Free, Zero-Silicon-Loss, and Faceted Raised Source/Drain" VLSI Technology, Jun. 16-18, 2009, 1 Page.

French Preliminary Search Report issued Aug. 27, 2013 in French Application 13 51142, filed on Feb. 11, 2013 ( with English Translation of Categories of Cited Documents and written opinion).

* cited by examiner

PRIOR ART

METHOD OF MAKING A TRANSISTOR

CROSS-REFERENCE TO RELATED APPLICATIONS

This application is a continuation of U.S. Ser. No. 14/177,592 filed Feb. 11, 2014 now abandoned, entitled "A METHOD OF MAKING A TRANSISTOR," the entire contents of which are incorporated herein by reference. U.S. Ser. No. 14/177,592 claims the benefit of priority under 35 U.S.C. 119 to France Patent Application No. 13 51142 filed Feb. 11, 2013.

TECHNICAL FIELD OF THE INVENTION

The present invention concerns in general transistors of the metal oxide semiconductor field effect (MOSFET) type and more particularly the reduction of parasitic elements limiting the operating speed thereof.

PRIOR ART

In a MOSFET transistor a current is made to flow between a "source" electrode and a "drain" electrode under the control of a control "gate", which creates a conduction channel between source and drain as soon as a sufficient voltage is applied thereto. The maximum switching speed of a MOSFET transistor depends on the speed with which it is possible to effectively establish the conduction current and make it disappear. It depends among other things on many physical parameters particular to the materials used, such as for example the mobility of the carriers of the semiconductor material used and the levels and type of doping of the various regions defining the electrodes. The switching speed also depends largely on the geometry and structure of the transistors. In particular, by means of the parasitic elements that are inevitably introduced by the practical implementation of these devices. Two particularly critical parasitic elements are firstly the serial access resistance of the source and drain electrodes and the stray capacitance between gate and source or drain on the other hand. These parasitic elements form a time constant that helps to limit the maximum switching speed of any transistor.

FIG. 1 shows a view in cross-section of a MOSFET transistor 100 characteristic of the prior art. The integrated circuits can be produced from elaborate substrates of the so-called SOI type, the acronym for silicon on insulator and more generally semiconductor on insulator. In FIG. 1 there is the original SOI substrate 110 that consists of an initial substrate 112, usually a homogeneous wafer of silicon, and a buried oxide layer 114 that provides the isolation of the components that will be manufactured in the fine surface semiconductor layer 116 present on the buried layer. The surface layer 116 usually consists of monocrystalline silicon. The isolation of each of the transistors 100 is computed by the production of lateral isolation trenches referred to STI, the acronym for shallow trench isolation. They reach the buried oxide layer so as to enclose each of the transistors in a continuous layer of oxide. These trenches, which are not necessary for an understanding of the invention, are not shown.

FIG. 2 summarises the main standard steps of manufacturing a MOSFET transistor representing the prior art. The first step 810 consists of producing, from the original SOI substrate 110, the STI isolation trenches mentioned above, which will provide the complete isolation of each of the transistors 100. At the following global step 820, the stacking is carried out of layers and the patterns that will constitute the gate stack 160 of each transistor comprising two essential layers: the thin gate oxide 122 and the control gate 124 proper. The latter is generally made from conductive polycrystalline silicon that fulfils the role of the metal in the MOS structure of the transistor or a stack of layers consisting of a metal and polysilicon. At the following step 830, a first layer of spacers 130 is produced on the flanks of each gate pattern. The spacers, made from silicon nitride, and the gate itself, will serve to protect the channel 180 during a first operation of implantation of the surface layer of silicon that will follow. It should be noted here that the spacers and the sources and drains are produced without implementing any photolithography operation. As mentioned above, a first implantation 840 of the source and drain regions 140 in the surface layer 116, generally made from monocrystalline silicon, is next effected. It should be noted that the sources and drains are identical; they have the same physical and geometric structure. Only their interconnections with other transistors and the voltages that will be applied in the electronic device in the course of implementation will be able to make it possible to finally attribute the role of source or drain to one or other of the electrodes. In the following description of the invention the source and drain electrodes are therefore undifferentiated and referenced by the same acronym "S/D" 140.

The following step 850 consists of increasing the thickness 142 of the source and drain (S/D) regions. An operation the main purpose of which is to reduce the access resistances 145 of these electrodes. The thickening of the S/D regions is conventionally done by epitaxial growth from the underlying layer, that is to say the layer 116 of monocrystalline silicon of the original SOI substrate. It is therefore a case of reducing one of the parasitic elements mentioned previously that limit the switching speed and the performances of the transistors. As it is found that the access resistance is inversely proportional to the thickness of the S/Ds, it should be noted here that there is every advantage, in order to significantly reduce this parasitic element, in increasing the protrusion of the S/Ds. This type of transistor and method is often referred to as "RSD", the acronym for "raised source drain".

The other standard operations consist of a step 860 of producing a second layer of spacers 150. This second layer of spacers serves to limit laterally, around the gate pattern, the siliconising regions that provide good electrical contact with the silicon of the raised S/Ds 140. The siliconising 123 and the metal contacts 170 are formed at step 880. Prior to this, at step 870, a second implantation of the S/Ds is performed, which provides a doping of these regions. As for the S/Ds, it should be noted that a siliconising of the top part of the gate stack 160 made from polycrystalline silicon is also carried out so that it is also possible to establish good electrical contact on this electrode. For reasons of clarity the gate contact and its siliconised region are however not shown in FIG. 1.

The other parasitic element mentioned previously is the capacitance 190 between the S/Ds and the gate. The spacers constitute the dielectric of this capacitance. The stray capacitance due to the spacers tends to increase proportionally to the increasing thickness 142 of the raised epitaxial layer of the S/Ds 140. It is thus found that, in the standard method of implementing MOSFETs that has just been briefly described, the conditions for optimisation of the main parasitic elements that limit their switching speed are perfectly antagonistic since, in order to reduce one, the access resistance of the source and drain 140, it is necessary to increase the protrusion of the latter, which causes an increase in the other parasitic element, that is to say the capacitance 190 between the gate and the S/Ds 140.

In order to compensate for the increase in the stray capacitance between the gate and the S/Ds 140, various techniques have been proposed. A first method consists of using spacers, the material of which has a lower permittivity than that of the silicon nitride currently used. For example, replacing nitride with silicon oxide significantly reduces the stray capacitance.

Replacing the nitride does however significantly complicate the standard method for manufacturing MOSFET transistors.

The standard method may also be modified by making provision for directly using spacers made from silicon oxide. This material does however lend itself much less well than nitride to the production of spacers and there does not currently exist any industrially reliable method that allows direct replacement of nitride.

One method that has been experimented with consists of the fact that the epitaxial growth, which makes it possible to obtain a raised source and drain in order to reduce the access resistance to these electrodes, is implemented while limiting the lateral growth of this epitaxy in order to move the S/D regions 140 away from the gate and therefore to reduce stray capacitance 190 while increasing the dielectric thickness between these regions. This so-called "faceted epitaxy" technique is however particularly difficult to master. The thickness of silicon deposited during the growth of a faceted epitaxy is very sensitive to the environment. Thus there are disparities in thickness between wide and narrow devices that may cause malfunctioning such as total siliconising and the appearance of leakage current that serious impairs the reliability of the devices. Disparities in thickness between the regions where the density of patterns is great and those where it is light are also found.

From this brief presentation of the known methods for producing MOSFET transistors, it is clear that there do not exist any simple and reliable methods that make it possible to reduce both the access resistance of the source and drain electrodes and the stray capacitance between these electrodes and the control gate.

The objective of the present invention is to propose a solution that meets at least some of these constraints. The other objects, features and advantages of the present invention will emerge from an examination of the following description and the accompanying drawings. Naturally other advantages may be incorporated.

SUMMARY OF THE INVENTION

According to one embodiment, the present invention proposes a method for manufacturing a transistor comprising the preparation of a stack of SOI layers of the semiconductor on insulator type comprising at least one substrate on which an insulating layer and an initial semiconductor layer are successively disposed, the method comprising:

the formation of at least one oxide pad extending from a top face of the insulating layer, the formation of at least one oxide pad comprising the following steps:
   the formation of at least one cavity in the initial semiconductor layer by etching;
   the formation of a layer of oxide on the surface of said stack of layers produced so that, in the bottom of the cavities, the film of oxide formed extends at least as far as the top face of the insulating layer; thus the film of oxide and the initial insulating layer form an uninterrupted electrically insulating layer;

a partial removal of the film of oxide so as to bare the initial semiconductor layer outside the cavity and to keep at least part of the film of oxide in the cavity in order to leave in place the oxide pad extending from the insulating layer;

the formation of an additional layer made from semiconductor material covering the initial semiconductor layer and the oxide pad and intended to form a channel for the transistor;

the formation of a gate stack above the oxide pad;

the formation of a source and drain on either side of the gate stack.

The invention thus proposes a particularly simple method for forming a source and drain situated at least partly under the gate, by forming pads of oxide on the insulating layer (typically a buried oxide layer) in order to form a continuous insulating layer, forming a channel on the oxide pads and forming a gate on each of these oxide pads.

Both the source and drain extend to a major extent at least on either side of the oxide pad forming a projecting relief and under the gate. Thus the transistor has a very special structure wherein the source and/or drain are reversed compared with known structures, that is to say they are situated under the gate. This structure reduces the stray capacitance between the gate and the source and drain. Furthermore it makes it possible to thicken the source and drain in a direction perpendicular to the plane of the substrate, which has the effect of reducing the access resistance of the electrodes of the source and drain.

Also advantageously, the invention makes it possible to make the height of the gate independent with respect to the height of the source and drain, which in particular makes it possible to reduce the height of the gate.

The present invention is particularly suitable for substrates of the semiconductor on insulator type, such as elaborate substrates of the silicon on insulator (SOI) type with a thin buried oxide layer (buried insulating oxide, BOX). This is because, by virtue of the invention, the thickness of the initial insulating layer is preserved, no etching of the initial BOX being necessary for obtaining a buried source and drain. The advantage of the invention is therefore being compatible with a substrate integrating a thin or thick BOX layer.

BRIEF DESCRIPTION OF THE FIGURES

The aims, objects, features and advantages of the invention will emerge more clearly from the detailed description of an embodiment of the latter that is illustrated by the following accompanying drawings, in which.

Figure 1:
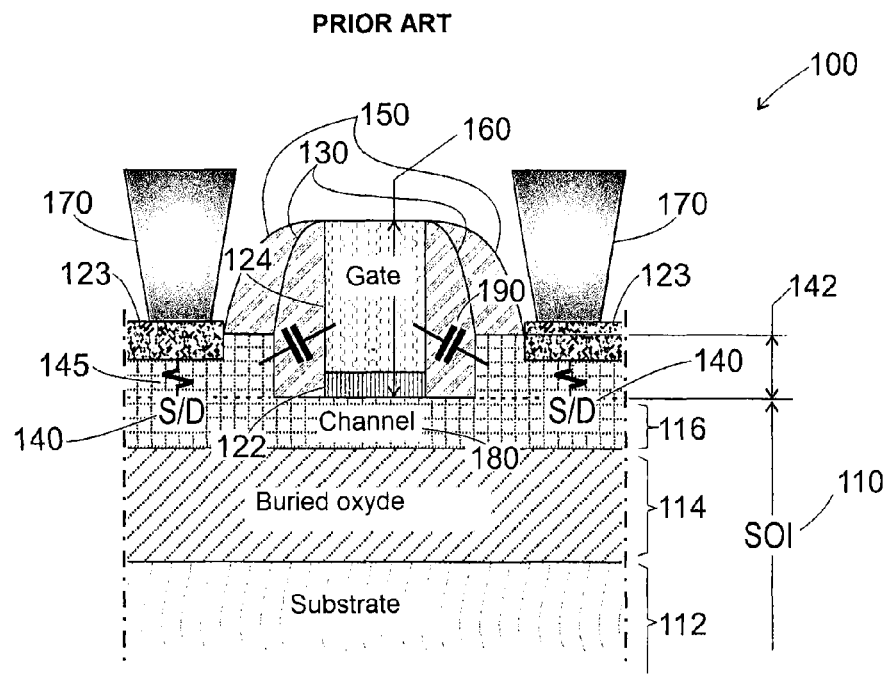
FIG. 1 shows a view in cross-section of a characteristic MOSFET transistor of the prior art.
Figure 2:
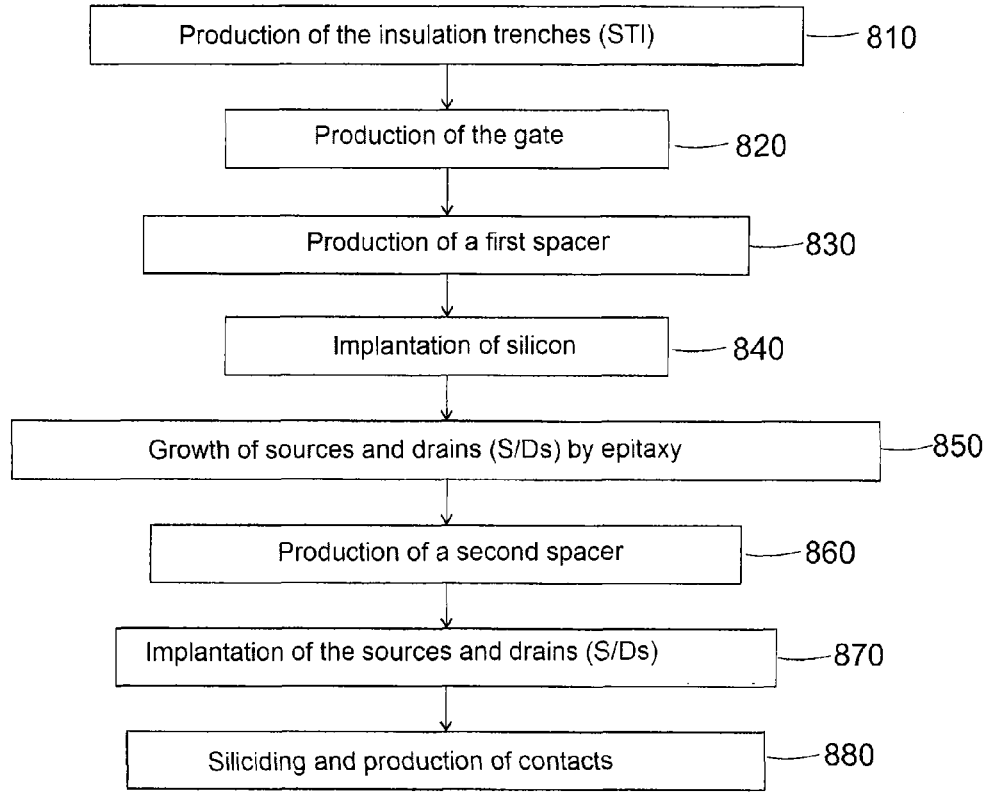
FIG. 2 summarises the main standard steps of manufacturing a MOSFET transistor representing the prior art.

The drawings are given by way of examples and are not limitative of the invention. They constitute outline schematic representations intended to facilitate understanding of the invention and are not necessarily to the scale of practical applications. In particular the relative thicknesses of the various layers and films are not representative of reality.

DETAILED DESCRIPTION OF THE INVENTION

Before beginning a detailed review of embodiments of the invention, optional features are stated below, which may optionally be used in association or alternatively:

Advantageously, the formation of the oxide pad is effected so that the width L of the oxide pad is greater than or equal to the width Lg of the gate stack.

Advantageously, the gate stack is formed by lithography and the oxide pad is formed so that: $L \geq Lg + 2 \times Des$, L being the width L of the oxide pad, Lg being the width of the gate stack and Des being the maximum imprecision of misalignment of the lithography. This makes it possible to ensure that the gate is always fully situated above the oxide pad without projecting beyond the ends of said oxide pad despite any unintentional misalignment of the lithography in order to form the gate.

These widths are taken in a direction parallel to the plane of the substrate and in the direction of movement of the electrons in the channel, that is to say on the figures in the horizontal direction contained in the plane of the cross-section depicted.

Advantageously, the method comprises a step of forming spacers on the flanks of the gate stack and the formation of the oxide pad is effected so that: $Lg + 2 \times Lsp \geq L$, L being the width of the oxide pad, Lg being the width of the gate stack and Lsp being the width of the spacer layer.

Advantageously, the partial removal of the oxide film effected so as to bare the initial semiconductor layer outside the cavity and to preserve at least part of the oxide film in the cavity comprises a polishing step of the mechanical and chemical type (CMP, the acronym for "chemical-mechanical planarisation") with stoppage on the initial semiconductor layer.

The additional layer made from semiconductor material covering the oxide pad and intended to form a channel for the transistor is a layer of crystalline semiconductor material. Preferably, it is made from monocrystalline semiconductor material.

Advantageously, the formation of an additional layer of semiconductor material covering the oxide pad and intended to form a channel for the transistor comprises the transfer of a layer of crystalline semiconductor material onto the oxide pad. Preferably, the transfer of the layer of semiconductor material is effected by a method comprising the detachment of a thin film of monocrystalline semiconductor material by rupture of a thicker layer at a weakened region. A person skilled in the art can refer for this purpose to the numerous known methods of transferring a layer by molecular bonding.

According to another embodiment, the initial semiconductor layer is crystalline, preferably monocrystalline, and the formation of an additional layer of semiconductor material covering the oxide pad and intended to form a channel for the transistor comprises:

the deposition of a layer of amorphous semiconductor material on the initial semiconductor layer and the oxide pad, heat treatment carried out so as to crystallise the layer of amorphous semiconductor material by solid-phase epitaxy from the initial semiconductor layer.

According to one embodiment, the formation of a source and drain comprises the doping of source regions on either side of the gate stack. This embodiment is particularly advantageous in the case where the thickness of the channel is so thin that it becomes difficult to produce a source and drain by epitaxy. Furthermore, this embodiment is particularly advantageous if it is wished for the semiconductor material of the source and drain to be the same as that of the channel.

Alternatively, the formation of a source and drain comprises: etching of at least the additional layer of semiconductor material so as to remove at least a portion of the thickness of the additional layer of semiconductor material that is not situated under the gate stack and so as to keep at least part of the additional layer of semiconductor material at the transistor channel; a growth of the source and drain regions by epitaxy from the semiconductor material forming the channel. Thus the etching re-forms a cavity on each side of the gate stack and the growth by epitaxy forms the source and drain regions in these re-formed cavities.

Preferably, the formation of a source and drain also comprises the doping of the source and drain regions during the step of growth of the source and drain regions by epitaxy.

This embodiment is particularly advantageous when it is wished for the material in the source and drain regions to be different from that of the channel. Preferably, the materials used for the channel on the one hand and for the source and drain regions have, for example, mesh parameters that differ by less than 1% and preferably by less than 0.5% in the plane parallel to the face of the substrate.

Said etching of at least the additional layer of semiconductor material is an anisotropic etching where the favoured etching direction is perpendicular to the plane of the substrate. Said etching may be highly anisotropic, that is to say, for a dimension etched in the direction perpendicular to the plane of the substrate, a zero or much lower dimension will be etched in a direction parallel to the plane of the substrate. Said etching may also be only slightly anisotropic, that is to say, for a dimension etched in the direction perpendicular to the plane of the substrate, a smaller dimension will be etched in a direction parallel to the plane of the substrate. Alternatively, the etching is isotropic.

According to a first embodiment, said etching of at least the additional layer of semiconductor material removes, on either side of the gate stack, the entire thickness of the additional layer of semiconductor material and the entire thickness of the initial semiconductor layer. Preferably, the etching is stopped on the insulating layer. Thus the etching bares the insulating layer on either side of the gate stack. The formation of the source and drain is effected by epitaxy from the semiconductor material remaining in place. This epitaxy is preferentially directed downwards, that is to say from the channel and in the direction of the substrate.

In a second embodiment, said etching preserves, on either side of the gate stack, a film formed by at least a portion of the thickness of the initial semiconductor layer and optionally by a portion of the additional layer of semiconductor material. Thus the etching is partial in that it does not bare the insulating layer on either side of the gate stack. Advantageously, in this case, the epitaxy is initiated by the lateral ends of the channel and/or by the film of semiconductor material left in place, on either side of the gate stack, on the insulating layer at the end of the etching. Typically only a top portion of the assembly formed by the additional layer of semiconductor material and the initial semiconductor layer is removed. Said top portion removed by anisotropic etching typically has a thickness of between 1 nm and 20 nm.

According to a first embodiment, the formation of at least one cavity is effected by etching only part of the thickness of the initial semiconductor layer in the bottom of the cavity so as to preserve an uninterrupted semiconductor layer on the surface of the insulating layer. Thus the insulating layer is not bared in the bottom of the cavities. Advantageously, this makes it possible to stop the etching before reaching the insulating layer, which reduces the etching time.

Preferably, the formation of an oxide layer on the surface of said stack of layers of the semiconductor on insulator type is done by oxidation of the initial semiconductor layer in order to form a continuous oxide film on the uncovered surface of the initial semiconductor layer. This embodiment makes it possible to obtain an oxide of very good quality. It also offers very good continuation of the insulation between the insulating layer and the oxide pad.

According to a second embodiment, the formation of at least one cavity is effected by etching the whole of the thickness of the initial semiconductor layer in the bottom of the cavities. Thus the insulating layer is bared in the bottom of the cavities.

According to one embodiment, the formation of a source and drain is effected so as to form the source and drain at least partly in the cavity.

According to one embodiment, the formation of a source and drain is effected so as to form the source and drain at least partly on either side of the oxide pad.

Preferably, the formation of an oxide layer on the surface of said stack of layers of the semiconductor on insulator type can be done by a deposition of oxide over the entire surface of said stack of layers. Preferably, the thickness of the deposition of oxide is at least equal to the depth of the cavity.

Preferably, the formation of at least one cavity in the initial semiconductor layer comprises, prior to the partial etching, a lithography step for protecting with a mask the regions that will not be etched.

Preferably, the formation of at least one cavity in the initial semiconductor layer by etching of the initial semiconductor layer comprises, prior to the etching, a step of oxidation of the initial semiconductor layer in the regions to be etched and over a thickness corresponding to the thickness to be etched. Advantageously, the oxide etching kinetics is very much superior to that of the semiconductor material. The oxidation step thus makes it possible better to control the etched thickness and therefore the depth of the cavities. Alternatively, no oxidation step is performed prior to the etching. The etching is then performed after the definition by lithography of the patterns defining the cavities to be etched.

Preferably, the etching of the cavities is effected by reactive ion etching (RIE).

Advantageously, the active layer is a layer of semiconductor material based on silicon or germanium.

The initial semiconductor layer, also referred to as the active layer of the semiconductor on insulator stack, is a layer of silicon, silicon-germanium, or materials of the elements in columns III/V of the periodic classification of elements.

The additional layer of semiconductor material is a layer of silicon, germanium, silicon-germanium or materials of the elements in columns III/V of the periodic classification of elements.

Preferably, provision is made for the initial semiconductor layer and the additional layer of semiconductor material to be identical materials.

Alternatively, materials that are different but exist in a compatible crystalline form can be provided. Thus the materials used have, for example, mesh parameters that differ by less than 1% and preferably less than 0.5% in the plane parallel to the face of the substrate. This is particularly advantageous for facilitating the formation of a crystalline and preferably monocrystalline channel by epitaxy for example.

Preferably, the initial insulating layer is a buried oxide layer in the stack of layers of the semiconductor on insulator type.

Preferably, the initial semiconductor layer is the active layer in the stack of layers of the semiconductor on insulator type.

Preferably, the transistor is a transistor of the MOSFET (field effect transistor) type.

In the context of the present invention, the term "on", "surmounts" or "underlying" does not necessarily mean "in contact with". Thus, for example, the deposition of a first layer on a second layer does not necessarily mean that the two layers are directly in contact with each other but means that the first layer at least partially covers the second layer while being either directly in contact therewith or being separated therefrom by another layer or another element.

In the context of the present invention, width means dimensions taken in a direction parallel to the plane of the bottom face of a substrate 112 and in the direction of movement of the electrons in the channel. Thickness means a dimension taken in a direction perpendicular to the plane of the bottom face of the substrate 112. Thus, in the figures illustrated, the width L of an oxide pad 311, the width Lg of a gate stack 160, and the width Lsp of the spacers 410 are taken in a horizontal direction and the thicknesses are taken in a vertical direction.

Figure 3:
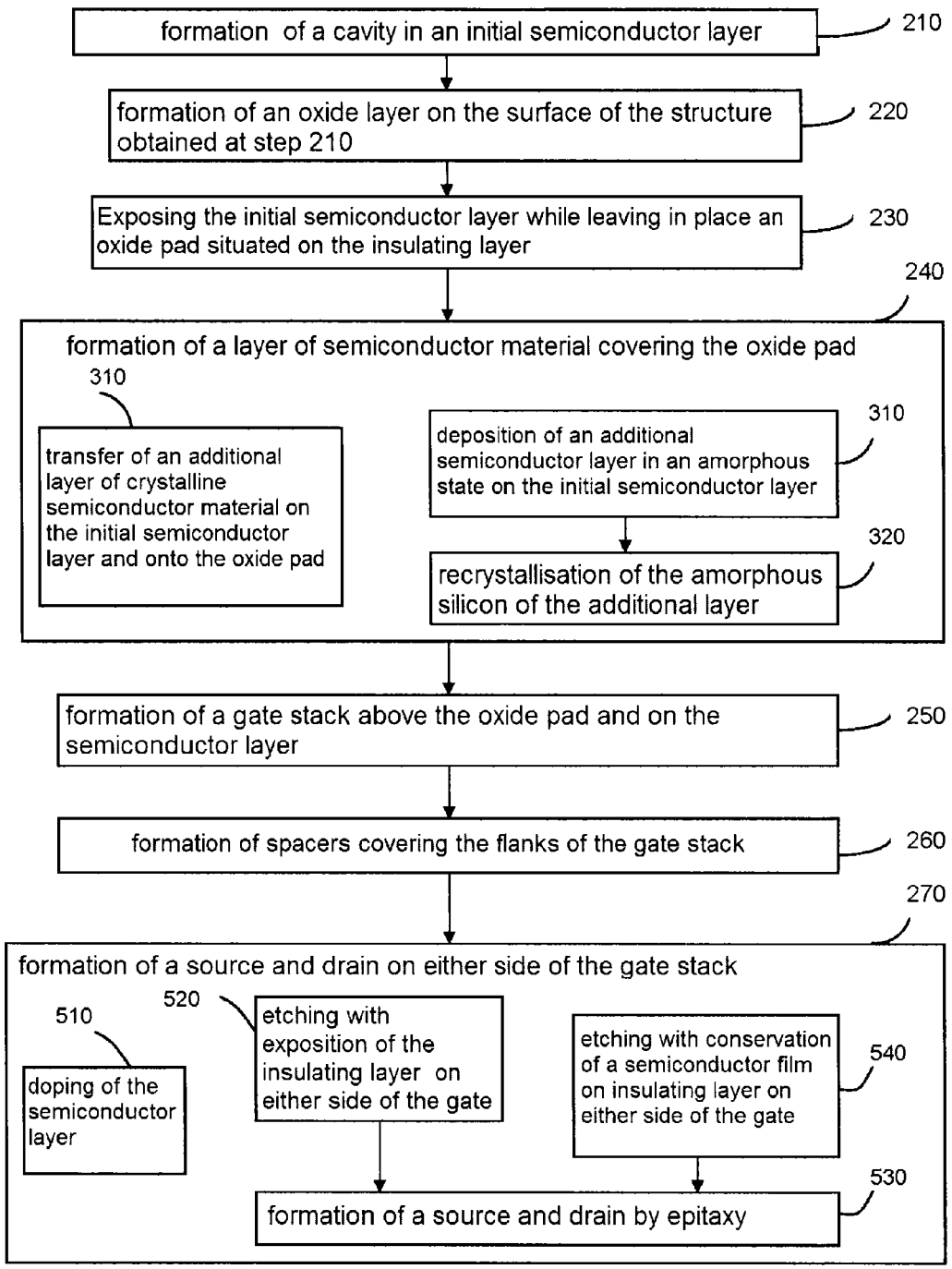
FIG. 3 summarises the main steps of manufacturing a transistor according to example embodiments of the invention.

FIG. 3 summarises the main steps of manufacturing a transistor 200 according to an example embodiment of the invention. These steps will be described with more detail with reference to FIGS. 4a to 12b. Only two transistors 200 will be illustrated in these figures in order to facilitate understanding of the invention. Naturally a much higher number of transistors may be effected during the same method.

The starting structure of the method according to the invention is a structure of the semiconductor on insulator type, for example of the SOI type. More precisely, the structure comprises a substrate 112, an insulating layer 114 (thin or thick) of buried oxide and an initial semiconductor layer 312 also referred to as a thin layer and forming the active layer of the stack of the SOI type. Advantageously, the thickness of the insulating layer 114 does not constitute a constraint for implementing the invention.

Step 210 consists of forming a cavity 315 for each transistor 200 to be produced. This cavity 315 can be produced either by etching only a portion of the thickness of the initial semiconductor layer 312 in the bottom of the cavities 315 (as illustrated in FIG. 4*a*) or by etching the whole of the thickness of the initial semiconductor layer 312 in the bottom of the cavities 315 (as illustrated in FIG. 4*b*).

Figure 4A:
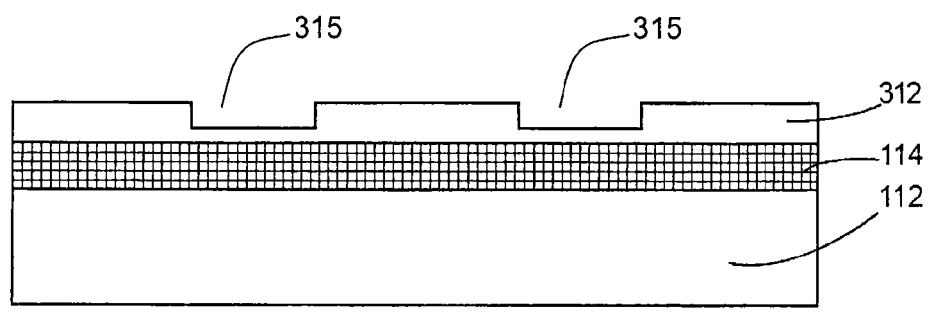
FIGS. 4a and 4b illustrate the structures obtained at the end of two embodiments of the step of forming a cavity in an initial semiconductor layer.

In the embodiment of the partial etching, the depth of the cavity 315 is defined so as to leave in place semiconductor material in the bottom of the cavities 315, as illustrated in FIG. 4*a*. Preferably, a thickness of the initial semiconductor layer 312 of around one to several nm (nanometers) is preserved in the bottom of the cavity 315. For example, in order to obtain a pad rising by 15 nm (that is to say a step difference of 15 nm) above the insulating layer 114 of the SOI stack, it is possible to leave a thickness of semiconductor material of around 6 nm in the bottom of the cavities 315. The height of the oxide pad 311 formed subsequently is referenced 316 in FIG. 6 described below. The semiconductor material is for example silicon, germanium or silicon-germanium.

Figure 4B:
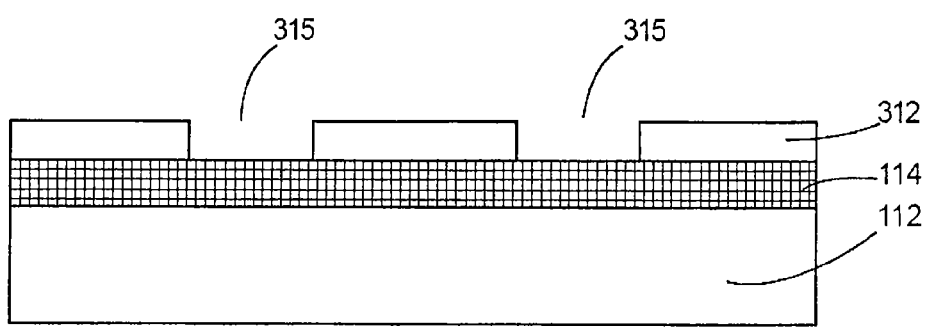

In the embodiment of the total etching of the regions of the initial semiconductor layer 312 intended to form the cavities 315 (as illustrated in FIG. 4*b*), an etching is carried out in order to remove the entire thickness of the initial semiconductor layer 312 in the bottom of the cavities 315. Thus no more material of the initial semiconductor layer 312 remains in the bottom of the cavities 315; in other words, the top surface of the insulating layer 114 at the cavities 315 is bared.

The height of the oxide pad 311 formed subsequently is referenced 316 in FIG. 6 described below. The semiconductor material is for example silicon, germanium or silicon-germanium.

In order to produce the cavities 315 by either partial or total etching of the regions of the initial semiconductor layer 312 intended to form the cavities 315, a lithography step is previously carried out in order to form a mask covering the regions that it is not wished to etch, that is to say the regions outside the cavities 315.

The width of the oxide pad 311 is dependent on the width of the cavity 315. It may be that the lithographies used firstly to form the cavities 315 and secondly used to produce the gate stack 316 have misalignment. In the context of the present invention, the gate stack 160 must be situated above the oxide pad 311 without projecting beyond the ends of said oxide pad 311. The cavity 315 is therefore produced so that its width L is greater than the width Lg of the gate stack 160. Advantageously, the following formula is applied to calculate the sizing of the oxide pad 311:

$L \geq Lg + 2 \times \text{lithographic misalignment}$

According to a first embodiment, the etching of the initial semiconductor layer 312 is carried out directly through the mask defining the patterns of the cavities.

According to another embodiment, the etching of the initial semiconductor layer 312 is carried out after an oxidation of the initial semiconductor layer 312 through the mask defining the patterns of the cavities. This oxidation step thus oxidises the areas not protected by the mask. This oxidation step makes it possible to very precisely control the thickness to be etched, taking advantage of the selectivity to etching of the oxide with respect to the semiconductor material. The oxidation thickness then directly defines the thickness of the regions of the initial semiconductor layer 312 to be etched subsequently. It should be noted that the oxidation tends to increase the size of the patterns to be etched and it is therefore necessary to take it into account during the step of lithography of the cavities.

In these two embodiments, the etching is preferably a reactive-ion etching (RIE). It is preferably anisotropic, directed perpendicular to the plane of the substrate 112.

Figure 5:
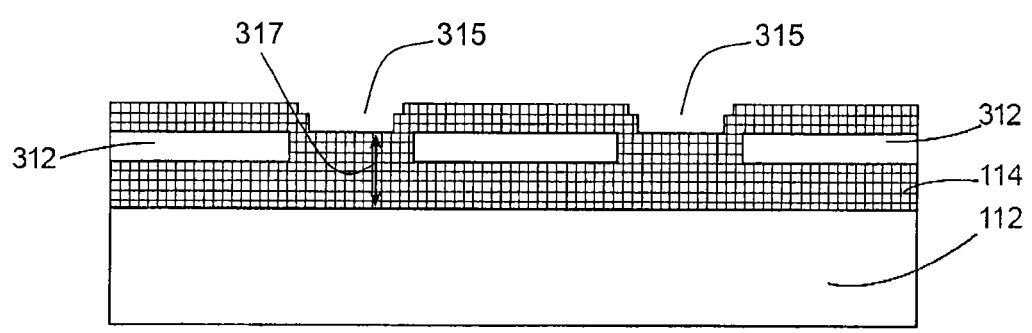
FIG. 5 illustrates the structure obtained at the end of the step of forming a continuous oxide film by oxidation of the initial semiconductor layer.

FIG. 5 illustrates the structure obtained at the end of the step 220 of formation of a continuous electrically insulating oxide layer on the surface of the structure obtained after the implementation of the previous step 210. According to the structure obtained at the end of step 210 (illustrated in FIGS. 4*a*, 4*b*), the step 220 can be performed either by oxidation of the initial semiconductor layer 312, or by a deposition of oxide over the entire surface of the structure obtained at the end of step 210.

In the case where a thickness of the initial semiconductor layer 312 is preserved in the bottom of the cavity 315 (as illustrated in FIG. 4*a*), step 220 consists of effecting a thermal oxidation in order to form a continuous oxide film on the uncovered surface of the initial semiconductor layer 312. The mask or the layer of resin used to form the cavities 315 will previously have been removed.

The oxidation parameters, in particular the duration of oxidation, are to be defined so as to oxidise the whole of the initial semiconductor layer 312 at the bottom of the cavity 315. Thus the entire initial semiconductor layer 312 present under the cavities 315 is oxidised. The oxide film formed in the bottom of the cavities 315 therefore extends as far as the insulating layer 114. It forms with the latter an uninterrupted layer of oxide. Thus the entire thickness 317 is formed by an insulating material, i.e. oxide. On the other hand, the initial semiconductor layer 312 is divided into several parts because of the presence of the oxide pads 311.

The oxidation may increase the size of the cavities in the initial semiconductor layer 312, which is not a problem in itself. It is then simply necessary to anticipate this as from step 210 in order to calculate the width of the patterns of the mask and cavities 315 to be etched before oxidation.

Alternatively, in the case where the bottom of the cavities 315 is bared (as illustrated in FIG. 4*b*), step 220 may also be performed, as illustrated above, by oxidation of the initial semiconductor layer 312. In another embodiment, step 220 is performed by a deposition of oxide over the entire surface of the structure obtained after the implementation of step 210. In this case, the deposited thickness of the oxide deposition is preferably at least equal to the depth of the cavity 315.

Figure 6:
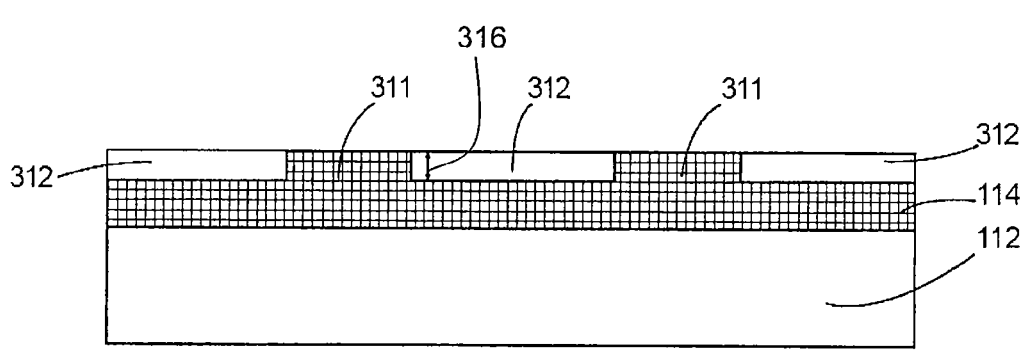
FIG. 6 illustrates the structure obtained at the end of the step of baring the initial semiconductor layer while leaving in place an oxide pad situated on the insulating layer.

FIG. 6 illustrates the structure obtained at the end of the step 230 of baring portions of the initial semiconductor layer 312, disposed between the cavities 315. This step 230 consists of removing the oxidised regions on top of the initial semiconductor layer 312 by carrying out a polishing, such as a chemical and mechanical polishing CMP. The CMP polishing stops on the initial semiconductor layer 312. Thus, after CMP, there is no longer any oxide on top of the initial semiconductor layer 312. Only the oxide pads 311 formed at the cavities 315 remain. Preferably, the thickness 316 is equal to that of the initial semiconductor layer 312 which remains after CMP.

Figure 7A:
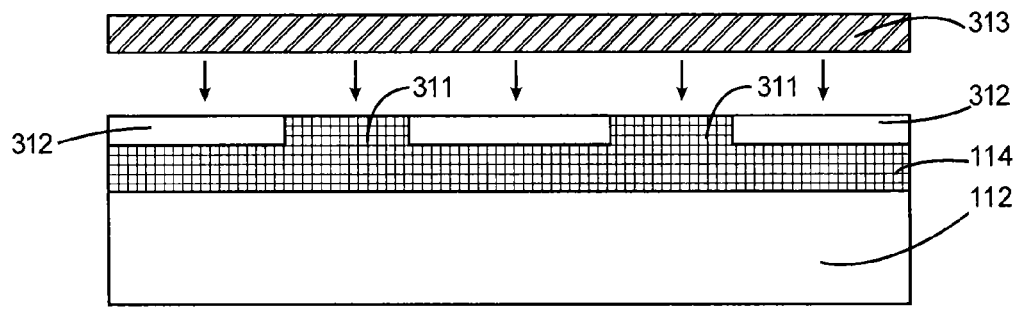
FIGS. 7a to 7c illustrate the structure obtained at the end of the steps of forming a layer of semiconductor material covering the oxide pad.
Figure 7B:
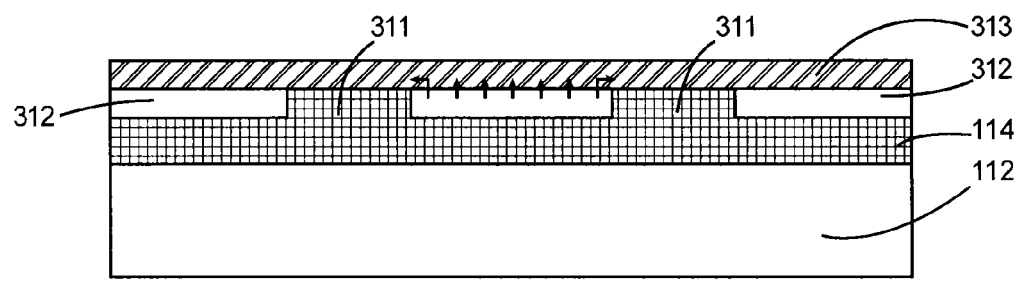
Figure 7C:
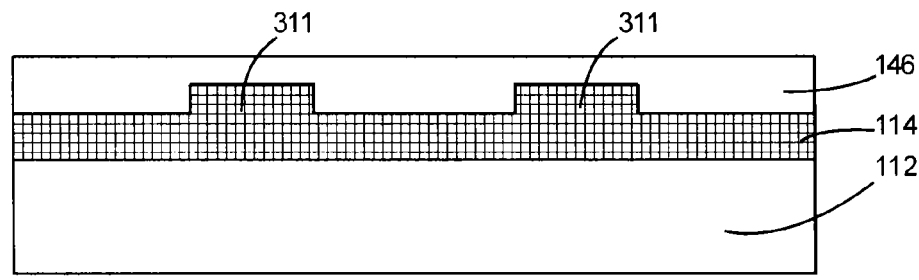

Next FIGS. 7a to 7c illustrate the structure obtained at the end of the step 240 of formation of a layer of semiconductor material covering the oxide pads 311.

More precisely, step 240 comprises the steps 310 and/or 320 of formation of an additional layer of semiconductor material 313 on the oxide pads 311, this additional layer of semiconductor material 313 being intended to form the channel 180 of each transistor 200. It is also intended to form an uninterrupted semiconductor layer 146 with the initial semiconductor layer 312. Two embodiments are presented hereinafter. FIG. 7c illustrates the structure obtained at the end of each of these embodiments.

Step 310, illustrated in FIG. 7a, consists of depositing an additional layer 313 of semiconductor material, advantageously crystalline, made from silicon for example. The thickness of the additional layer 313 is preferably between 5 and 20 nm. Advantageously, this additional layer 313 is transferred onto the stack comprising the oxide pads 311 and the initial semiconductor layer 312 from another structure, such as a donor substrate. To reflect this transfer, it is possible for example to use the SMART CUT technique developed by the company SOITEC. Typically, the additional layer 313 is a thin film that is detached from a donor substrate while previously having created in this donor substrate a weakened area, for example by ion implantation.

The portions of the initial semiconductor layer 312 and the additional layer of semiconductor material 313 form an interrupted semiconductor layer 146, as illustrated in FIG. 7c.

Preferably, the initial semiconductor layer 312 and the additional layer of semiconductor material 313 are monocrystalline.

Optionally, the thickness of the semiconductor layer 146 is adjusted by carrying out a CMP polishing. Advantageously, the thickness of the channel 180 formed by the portion of the additional layer 313 situated above the oxide pad 311 is thus adjusted.

This embodiment is particularly advantageous for obtaining a monocrystalline channel without defect in the crystalline structure, including at the middle of the channel 180. The channel 180 is therefore homogeneous and has a crystalline structure without defects or with a limited number of defects.

According to the other method, the uninterrupted semiconductor layer 146 is re-formed by solid-phase epitaxy. The semiconductor material as deposited from the additional layer 313 is then amorphous (for example amorphous silicon). This additional layer 313 is deposited, at a temperature of 400° C. for example, on the face having the oxide pads 311 and the initial semiconductor layer 312.

FIG. 7b illustrates the structure obtained during the step 320 of recrystallisation of the semiconductor material of the amorphous additional layer 313, recrystallisation initiated by the crystalline structure of the initial semiconductor layer 312. In the case where this material is amorphous silicon, heat treatment is carried out at a preferential temperature of 500° C., so that recrystallisation of the amorphous silicon of the layer 313 is initiated by the crystalline semiconductor material of the layer 312. Thus a crystalline semiconductor layer 146 is formed from the layer 313 deposited in the amorphous state and the crystalline layer 312, as illustrated in FIG. 7c. Preferably, the layer 312 is monocrystalline and the semiconductor layer 146 obtained after recrystallisation of the layer 313 is also monocrystalline.

Figure 8:
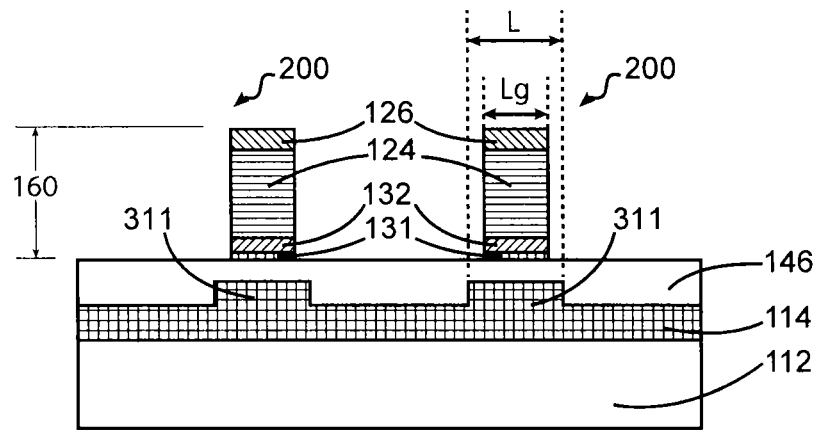
FIG. 8 illustrates the structure obtained at the end of the step of forming a gate stack vertically in line with the oxide pad and on the layer of semiconductor material.

FIG. 8 illustrates the structure obtained at the end of step 250 of formation of a gate stack 160 vertically in line with an oxide pad 311. The stack 160 comprises for example the following layers stacked from the semiconductor layer 146: a gate insulation layer, often referred to as a thin gate oxide 131 or high-k layer, a metal layer 132, the gate 124, also referred to as the gate electrode, and a hard mask 126 covering the top surface of the gate 124. The invention is not limited this gate stack 160 and some of the layers mentioned below may not be present or other layers may be added without departing from the scope of the present invention.

As mentioned previously at step 210, each gate stack 160 is deposited in line with an oxide pad 311 without projecting beyond the ends of said oxide pad 311. The gate is not necessarily aligned with the centre of the pad. In order to avoid or reduce any misalignment of the source and drain 140 with respect to the gate stack 160, it is possible to use the following formula mentioned previously in order to define the widths of the gate and cavities: L≥Lg+2×maximum lithographic misalignment. This is because any misalignment of the gate stack 160 with respect to the oxide pad 311 has an impact on numerous parameters such as the serial resistance, the electrostatic control of the channel, the stray capacitance, the leakage, the speed, etc.

The gate stack 160 is produced in a conventional manner, for example by a succession of lithographies and etchings.

Figure 9:
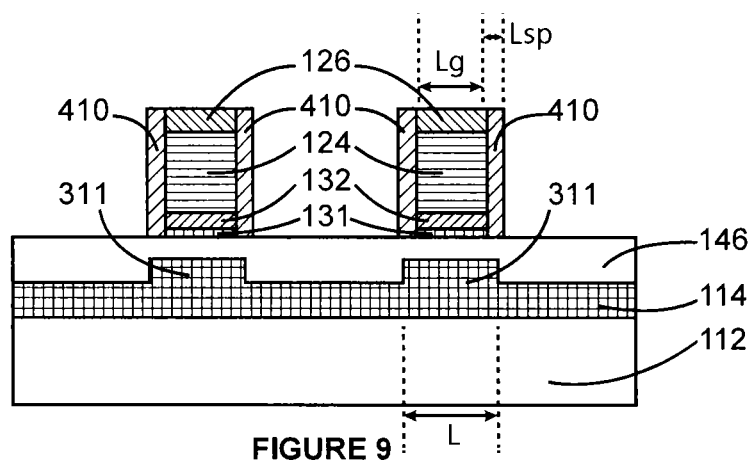
FIG. 9 illustrates the structure obtained at the end of the step of forming spacers covering the flanks of the gate stack.

FIG. 9 illustrates the structure obtained at the end of the step 260 of formation of protective layers covering the flanks of the gate stack 160. These protective layers, normally referred to as spacers 410, are situated on either side of the gate stack 160, extending mainly perpendicular to the plane of the substrate 112 and covering the flanks of the gate 124 at least. They are advantageously made from silicon nitride. The hard mask 126 and the spacers 410 protect the gate stack 160 so that the flanks of the gate stack 160 are not etched during following operations. In particular, as will emerge in the remainder of the description, the hard mask 126 and the spacers 410 are made from material resistant to the cavity etching substances that are used during step 520 described below.

Particularly advantageously, for positioning the gate stack 160 vertically in line with the oxide pad 311, the following condition is applied:

$$Lg+2\times Lsp \geq L,$$

in which Lsp is the width of the spacers 410.

In addition, the maximum misalignment of the gate stack 160, e.g. 3 to 4 nm, must be less than the width of the spacers 410, e.g. 6 to 8 nm. The ends of the spacers 410 must be above the very thick regions of the semiconductor material of the semiconductor layer 146. Thus the free faces of the spacers 410, i.e. those turned towards the outside of the gate stack 160, are not situated vertically in line with an oxide pad 311. On the other hand, the gate 124 must be situated vertically in line with the oxide pad 311, that is to say whatever its position above the oxide pad, but its flanks must not project beyond the ends of said oxide pad 311.

Figure 10A:
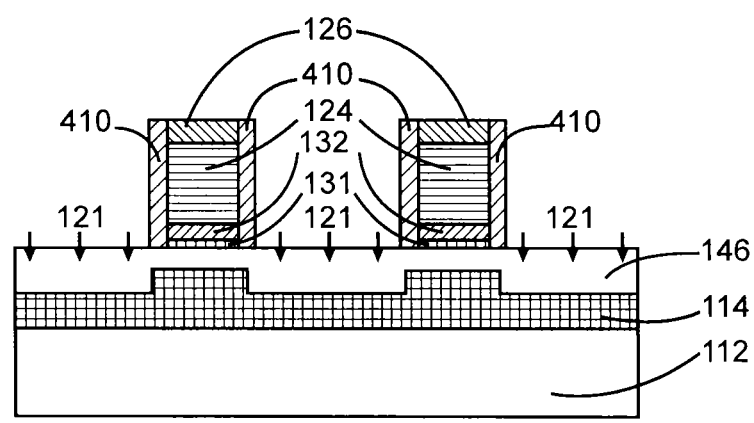
FIGS. 10a and 10b illustrate an embodiment of the source and drain comprising a doping of the semiconductor layer.
Figure 10B:
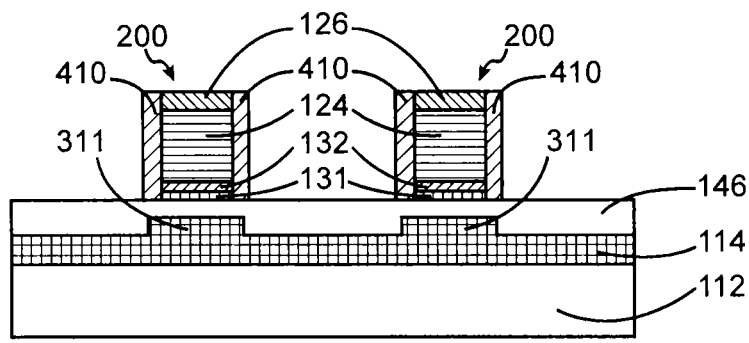
Figure 11A:
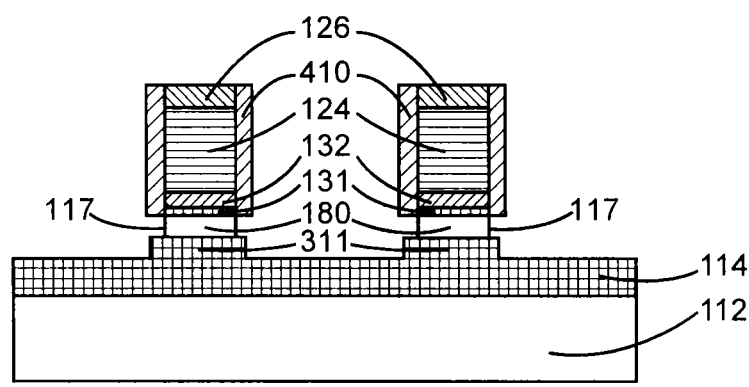
FIGS. 11a and 11b illustrate another embodiment of the source and drain comprising an etching of the entire thickness of the semiconductor material and the formation of the source and drain by epitaxy from the channel.
Figure 11B:
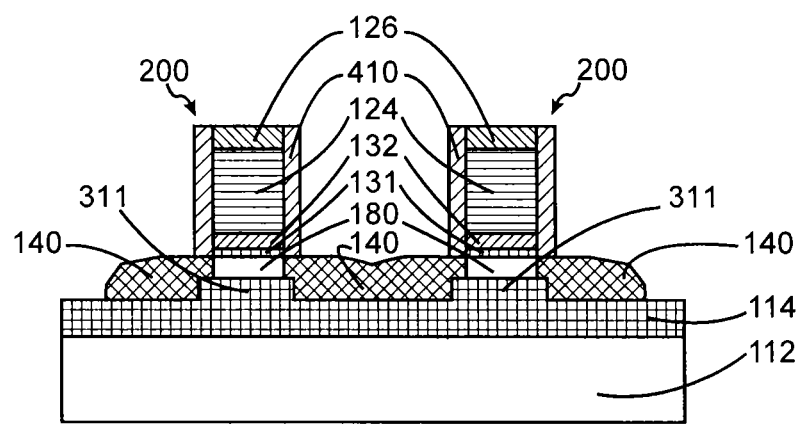
Figure 12A:
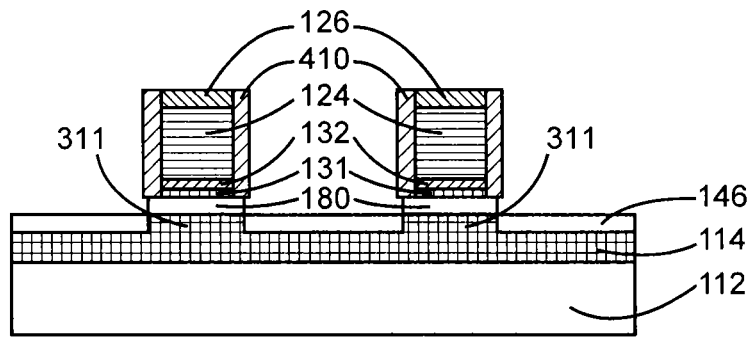
FIGS. 12a and 12b illustrate another embodiment of the source and drain comprising a partial etching of the semiconductor material and the formation of the source and drain by epitaxy.
Figure 12B:
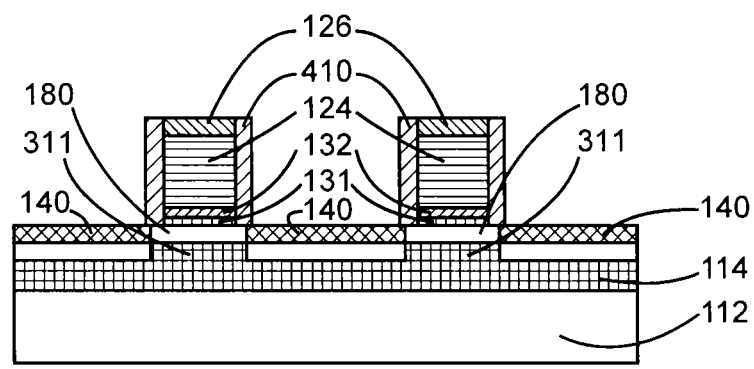

The following step 270 consists of producing the source and drain regions 140 and may be implemented by one of the following three embodiments 510, 520, 540 respectively illustrated in FIGS. 10a, 10b (step 510), FIGS. 11a and 11b (step 520) and FIGS. 12a and 12b (step 540).

The first embodiment illustrated in FIGS. 10a and 10b is particularly advantageous if it is wished for the material of the source and drain 140 to be the same as that of the channel 180. The second and third embodiments provide firstly an etching of the semiconductor layer 146 carried out while preserving the latter at least at a region forming the channel 180 and secondly an epitaxy from this region. This offers the possibility of having a source and drain 140 the material of which may be different from that of the channel 180.

FIG. 10*a* illustrates the structure obtained at the end of the step 510 of doping the semiconductor layer 146 re-formed from the layers 312 and 313 and in accordance with one of the embodiments of step 240 illustrated in FIG. 3. This semiconductor layer 146 is doped by ion implantation 121 on either side of the gate 124 in order to form the source and drain 140.

The structure 200 thus obtained (illustrated in FIG. 10*b*) has a source and drain 140 below the gates 124. The stray capacitances are therefore reduced whereas the thickness of the source and drain 140 can be freely adapted to reduce the access resistance to the transistor 200.

The first embodiment of formation of the source and drain 140 has the advantage of being simple and independent of the thickness of the channel 180. This makes it possible to form a source and drain 140 in the case where the channel 180 is so thin that it becomes difficult to produce a source and drain 140 by epitaxy.

FIG. 11*a* illustrates the structure obtained at the end of the step 520 of etching the whole of the thickness of the semiconductor layer 146 with the exception of the region situated under the gates 124 and of defining the channel 180. This step 520 is explained below.

At the end of the step of formation of the gate stack 160 and the preferential step of formation of the spacers 410, an etching is carried out in order to remove, on either side of the gate stack 160, the entire thickness of the re-formed semiconductor layer 146 while preserving the entire thickness of this semiconductor layer 146 under the gate 124. This etching is for example a wet etching of the TMAH (tetramethylammonium hydroxide) type. Preferably, it is anisotropic and directed perpendicular to the surface of the substrate 112. According to another embodiment, in particular if the spacers are sufficiently wide with respect to the thickness of the layer 146, the etching may be only slightly anisotropic or even isotropic. The regions of the semiconductor layer 146 situated below the gate 124 are left in place so as to form the channel 180.

In the example illustrated in FIG. 11*a*, the entire semiconductor layer 146 is removed with the exception of the regions situated under the gates 124.

Advantageously, a thickness of the semiconductor layer 146 is removed under the spacers 410. Preferably, the entire thickness of the semiconductor layer 146 situated under the spacers 410 is removed. The lateral ends of the channel 180 are thus bared and the bottom ends of the spacers 410 form a rim above each lateral end of the channel 180. The advantage of this feature for promoting epitaxy directed downwards is detailed hereinafter. Lateral ends of the channel 180 means the ends that appear in the plane of the figures. The lateral ends of the channel 180 are indicated by the reference 117 in FIG. 11*a*. As mentioned previously, the gate stack 160, protected by the spacers 410 and the hard mask 126, is not etched during the etching of the semiconductor layer 146.

FIG. 11*b* illustrates the structure obtained at the end of the step 530 of formation of the source and drain 140. An epitaxy initiated by the semiconductor material of the channel 180 is effected in order to fill the volumes formed on either side of the gate stack 160 and under the gate 124.

The channel 180 is preferably a monocrystalline semiconductor material.

It is possible for example to use identical materials for on the one hand the channel 180 formed by the semiconductor layer 146 and on the other hand the source and drain regions 140 formed by epitaxy. It is possible for example to use silicon or other semiconductor materials also able to be used in a monocrystalline form, such as germanium (Ge) or alloys of these two materials (Si—Ge).

Alternatively, this embodiment makes it possible to use different materials for the channel 180 formed by the semiconductor layer 146 and for the source and drain regions 140 formed by epitaxy. Thus, for this alternative, it is possible to provide, for the source and drain regions 140, a material different from that of the channel 180 but existing in a crystalline form suited to the crystalline lattice of the channel 180, that is to say it has, for example, mesh parameters that differ by less than 1% and preferably less than 0.5% from that of the material of the channel 180 in the plane parallel to the face of the substrate 112.

The epitaxy, from the bared lateral ends of the channel 180, is done downwards, preventing the source and drain regions 140 coming opposite the gate 124. In addition, the presence of the spacers 410 that are on top of the lateral ends of the channel 180 forming a rim above the latter tends to prevent the epitaxy from rising in the direction of the gate 124. The spacers 410 thus promote the epitaxial growth downwards.

Preferentially, a doping of the source and drain regions 140 is effected simultaneously with the growth by epitaxy. This type of doping is normally referred to as in situ doping.

FIG. 12*a* illustrates the structure obtained at the end of the step 540 of partial etching of the semiconductor layer 146 with the exception of the regions situated under the gate stack 160 and definition of the channel 180. This step 540 is explained below.

As illustrated at step 520 above, the thickness of the semiconductor layer 146 below the gate stack 160 is entirely preserved during the performance of step 540 so as to form the channel 180. On the other hand, a film of the semiconductor layer 146 is left in place on the insulating layer 114 outside the region situated in line with the gate stack 160, as illustrated in FIG. 12*a*. This film consists at least partly of the layer 312 and optionally part of the thickness of the layer 313.

To this end, an anisotropic etching, preferably a reactive ion etching RIE, is performed in order to remove, on either side of the gate stack 160, a portion of the thickness of the semiconductor layer 146. This thickness is preferably between 1 nm and 20 nm. In addition, as mentioned previously, the gate stack 160, protected by the spacers 410 and the hard mask 126, is not etched during this step 540.

FIG. 12*b* illustrates the structure obtained at the end of step 530 of formation of the source and drain 140. The source and drain 140 are formed by epitaxy. Advantageously, a doping is carried out of the source and drain regions 140 simultaneously with the growth by epitaxy. This type of doping is normally referred to as in situ doping.

The epitaxy is initiated at least partly by the semiconductor film left in place by partial etching of the layer 146. According to another embodiment, the epitaxy is initiated by the lateral ends of the channel. According to another embodiment, the epitaxy is initiated by the lateral ends of the channel and by the semiconductor film left in place by the partial etching of the layer 146.

In all the embodiments described above, the thickness of the source and drain regions 140 can be freely adapted to reduce the access resistance to the transistor 200 while maintaining these source and drain regions 140 mainly and preferably entirely under the gate 124, thus reducing the stray capacitance.

Particularly advantageously, the source and drain 140 are auto-aligned with the gate 124.

The invention is not limited to the embodiments previously described but extends to any embodiment covered by the claims.

The invention claimed is:

1. A method for manufacturing a transistor on a stack of layers of the semiconductor on insulator type comprising at least one substrate on which an insulating layer and an initial semiconductor layer are successively disposed, comprising:
    forming at least one oxide pad extending from a top face of the insulating layer, comprising the following steps:
        forming at least one cavity in the initial semiconductor layer by etching;
        forming an oxide on the surface of said stack of layers of the semiconductor on insulator type, produced so that, in the bottom of the cavities, the oxide formed extends at least as far as the insulating layer; and
        partially removing the oxide so as to expose the initial semiconductor layer outside the cavity and to keep at least part of the film of oxide in the cavity in order to leave in place the oxide pad extending from the insulating layer;
    forming an additional layer made from a semiconductor material covering the oxide pad and forming a channel for the transistor;
    forming a gate stack above the oxide pad;
    forming a source and drain on either side of the gate stack and at least partly on either side of the oxide pad.

2. A method according to claim 1, wherein the forming a source and drain comprises forming the source and drain at least partly in the cavity.

3. A method according to claim 1, comprising a step of forming spacers on the flanks of the gate stack and wherein the oxide pad is formed so that: $Lg+2 \times Lsp \geq L$, L being the width L of the oxide pad, Lg being the width of the gate stack and Lsp being the width of the spacers.

4. A method according to claim 1, wherein the partially removing the oxide comprises an etching step of the mechanical and chemical type with stoppage on the initial semiconductor layer.

5. A method according to claim 1, wherein the forming the additional layer comprises forming a layer of monocrystalline semiconductor material.

6. A method according to claim 1, wherein the initial semiconductor layer is crystalline and wherein the forming the additional layer of semiconductor material comprises:
    depositing a layer of amorphous semiconductor material on the initial semiconductor material and the oxide pad,
    heating to crystallise the layer of amorphous semiconductor material by solid-phase epitaxy from the initial semiconductor layer.

7. A method according to claim 1, wherein the forming a source and drain comprises doping the source and drain regions on either side of the gate stack.

8. A method according to claim 1, wherein the forming at least one cavity in the initial semiconductor layer by etching comprises, prior to the etching, oxidizing the initial semiconductor layer in the regions to be etched and over a thickness corresponding to the thickness to be etched.

9. A method according to claim 1, wherein the initial semiconductor layer comprises a layer of at least one of silicon, germanium, silicon-germanium or materials of the elements in columns III/V of the periodic classification of elements and wherein the additional layer of semiconductor material comprises a layer of at least one of silicon, germanium, silicon-germanium or materials of the elements in columns III/V of the periodic classification of elements.

10. A method according to claim 1, wherein identical materials are provided for the initial semiconductor layer and the additional layer of semiconductor material.

11. A method according to claim 1, wherein the insulating layer comprises a buried oxide layer in the stack of layers of the semiconductor on insulator type and wherein the initial semiconductor layer comprises the active layer in the stack of layers in the semiconductor on insulator type.

12. A method according to claim 1, wherein the forming the oxide pad comprises forming the oxide pad so that the width L of the oxide pad is greater than or equal to the width Lg of the gate stack.

13. A method according to claim 12 wherein the gate stack is formed by lithography and wherein the oxide pad is formed so that: $L \geq Lg + 2 \times Des$, L being the width L of the oxide pad, Lg being the width of the gate stack and Des being the maximum imprecision of misalignment of the lithography.

14. A method according to claim 1, wherein the forming the additional layer comprises a transfer of a layer of crystalline semiconductor material onto the oxide pad.

15. A method according to claim 14, wherein the transfer of the additional layer comprises a detachment of a thin film of monocrystalline semiconductor material by rupture of a thicker layer at a weakened region of a substrate of monocrystalline semiconductor material.

16. A method according to claim 1, wherein the forming a source and drain comprises:
    etching the additional layer of semiconductor material so as to remove at least a portion of the thickness of the additional layer of semiconductor material that is not situated under the gate stack and so as to preserve at least part of the additional layer of semiconductor material at the channel of the transistor;
    growing the source and drain regions by epitaxy from the semiconductor material remaining in place.

17. A method according to claim 16, wherein forming a source and drain also comprises doping the source and drain regions during the step of growth of the source and drain regions by epitaxy.

18. A method according to claim 16, wherein said etching the additional layer of semiconductor material comprises anisotropic etching wherein the favoured direction of etching is perpendicular to the plane of the substrate.

19. A method according to claim 16, wherein said etching the additional layer of semiconductor material comprises removing, on either side of the gate stack, the entire thickness of the additional layer of the semiconductor material and the entire thickness of the initial semiconductor layer.

20. A method according to claim 19, wherein the growing the source and drain regions by epitaxy is initiated from the semiconductor material forming the channel.

21. A method according to claim 16, wherein said etching the additional layer comprises preserving, on either side of the gate stack, a film formed by one of at least a portion of the thickness of the initial semiconductor layer and a portion of the additional layer of semiconductor material.

22. A method according to claim 21, wherein the growing the source and drain regions by epitaxy is initiated at least by said film preserved on either side of the gate stack.

23. A method according to claim 1, wherein forming at least one cavity comprises etching only part of the thickness of the initial semiconductor layer in the bottom of the cavities so as to preserve an uninterrupted semiconductor layer on the surface of the insulating layer.

24. A method according to claim 23, wherein the forming an oxide on the surface of said stack of layers of the semiconductor on insulator type comprises oxidizing the initial semiconductor layer in order to form a continuous film of oxide on the uncovered surface of the initial semiconductor layer.

25. A method according to claim 1, wherein the forming at least one cavity comprises etching of the whole of the thickness of the initial semiconductor layer in the bottom of the cavities.

26. A method according to claim 25, wherein the forming the oxide comprises depositing the oxide over the entire surface of said stack of layers.

* * * * *